United States Patent [19]

Lu et al.

[11] Patent Number: 5,399,108
[45] Date of Patent: Mar. 21, 1995

[54] LIF PGA SOCKET AND CONTACT THEREIN AND METHOD MAKING THE SAME

[75] Inventors: Sidney Lu, Taipei; Ching-ho Lai, Taipei Hsien, both of Taiwan, Prov. of China

[73] Assignee: Tongrand Limited, Hong Kong

[21] Appl. No.: 118,805

[22] Filed: Sep. 8, 1993

[51] Int. Cl.6 .............................................. H01R 13/10
[52] U.S. Cl. .................................. 439/682; 439/733; 439/857
[58] Field of Search ................................ 439/682–691, 439/842–845, 856–858, 861, 862, 876

[56] References Cited

U.S. PATENT DOCUMENTS

| | | | |
|---|---|---|---|
| 3,718,895 | 2/1973 | Reynolds et al. | 439/853 |
| 3,989,331 | 11/1976 | Hanlon | 439/876 |
| 4,217,024 | 8/1980 | Aldridge et al. | 439/682 |
| 4,317,609 | 3/1982 | Lapraik | 439/857 |
| 4,439,001 | 3/1984 | Curley et al. | 439/682 |
| 5,282,758 | 2/1994 | Onoue | 439/876 |

*Primary Examiner*—Larry I. Schwartz
*Assistant Examiner*—Hien D. Vu

[57] ABSTRACT

An electrical socket (10) includes an insulative housing (12) with cavities (14) extending vertically therethrough and a plurality of contacts (30) retained in the cavities (14), respectively. An engagement bar (22) is positioned proximate the upper open end of each cavity (14) so that when the contact is assembled in each corresponding cavity (14), the front portions of the spring arms (40) of each contact (30) can move along a guiding pin (62), which is inserted into the cavity (14) from the top open end temporally only for the sake of assembling of the contacts (30) within the socket (10), and be deflected outwardly so that the tips (44') of the spring arms (40) of the contact (30) can pass the engagement bar (22) and be positioned by the sides of the engagement bar (22). Therefore, the tips (44') of the spring arms (40) of the contact (30) can abut against the opposite sides of the engagement bar (22) when the guiding pin (62) is removed from the socket (10), and a larger space is formed between the contact sections (42) of the spring arms (40) of the contact (30) for easy and low insertion force of the pins downward extending from the PGA component.

4 Claims, 5 Drawing Sheets

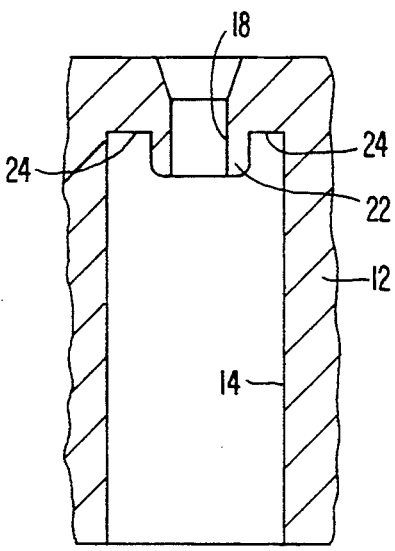
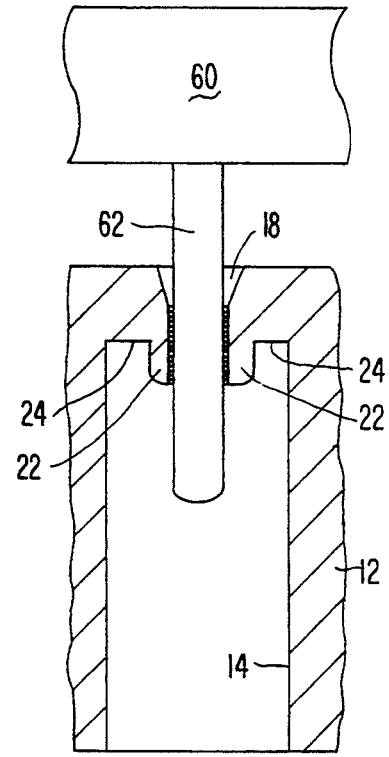
FIG. 4(A)
FIG. 4(B)
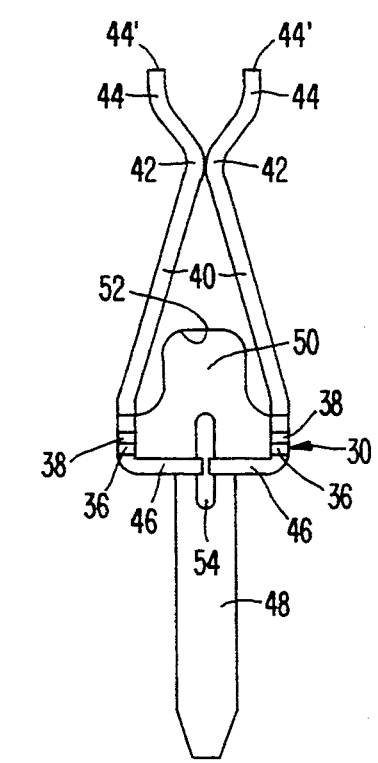
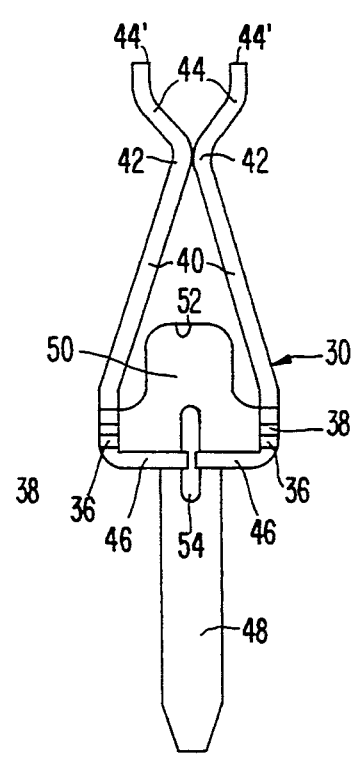

FIG. 4(C)
FIG. 4(D)
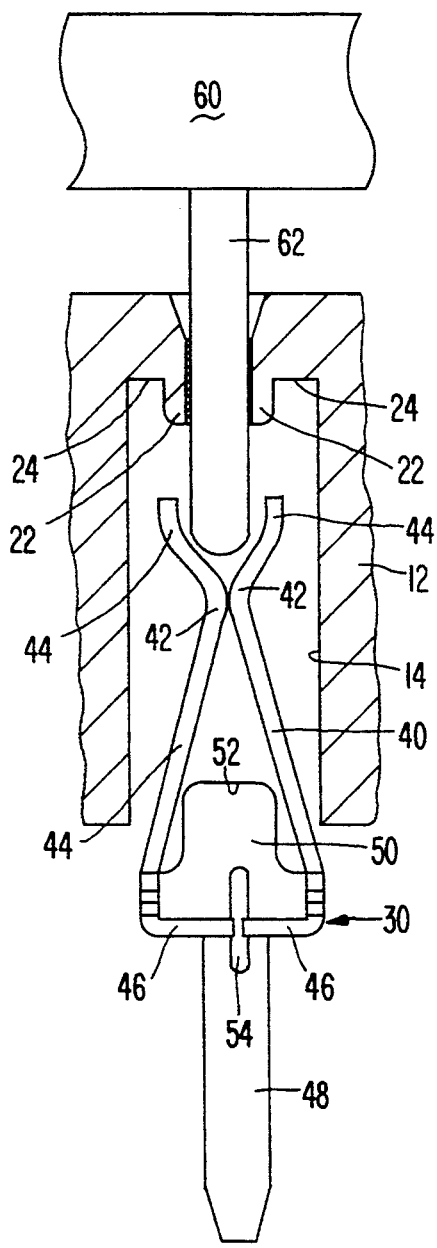
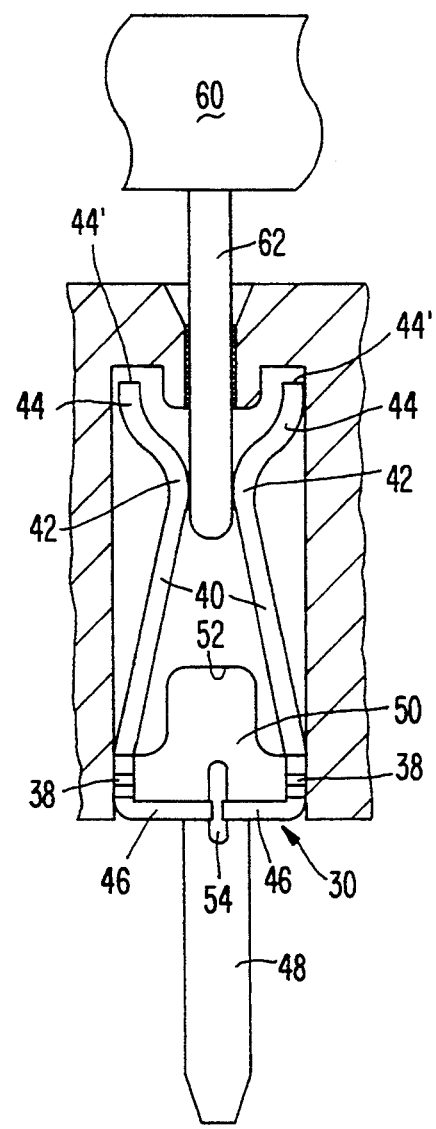

LIF PGA SOCKET AND CONTACT THEREIN AND METHOD MAKING THE SAME

BACKGROUND OF THE INVENTION

1. Field of The Invention

The invention relates to a low insertion force (LIF) socket connector for connecting an electrical pin grid array (PGA) component to a circuit board and will have application to a assembling method of such socket.

2. The Prior Art

High pin count PGA components become popular in application of computer industry because of the requirements of high speed signal transmission and great processing capacity. It can be understood that the more the pins are, the higher the insertion force is when such PGA component is mated with the corresponding socket connector. Accordingly, to achieve low insertion force (LIF) or zero insertion force (ZIF) design in such PGA socket connector is desired. Many zero insertion force PGA sockets are developed as disclosed in U.S. Pat. Nos. 4,468,072, 4,498,725, 4,648,669, 4,674,811, 4,836,798, 4,887,974, 4,889,499, 4,988,310, 5,002,499, 5,013,256, 5,017,152, 5,037,321, 5,057,031, 5,059,135, 5,092,789, 5,123,855, 5,167,515, 5,186,642, 5,192,221 and 5,213,531. Such mechanically actuated ZIF socket employs a free-moving cam. In the open position, the cam allows the PGA component to be inserted and withdrawn without force. However, when the cam is actuated into the closed position via lever, hex nut etc., the normally closed contacts maintain a constant pressure on the PGA pins.

By contrast, the non-mechanically actuated LIF socket is mated to the socket with an applied force. Even though ZIF style is superior to LIF style from a viewpoint of technical consideration of insertion force, the former can not completely replace the latter in computer industry due to the fact that ZIF sockets are more than double the price of LIF sockets now because there are additional components thereof such as cams, levers, in ZIF sockets in comparison with LIF sockets. Therefore, some computer manufacturers still prefer to use LIF sockets in their product for consideration of the competitive price.

Contacts used in LIF PGA sockets are generally of two types. The first type is of two pieces design including a screw-machined cylindrical sleeve accompanying an inserted clip as disclosed in U.S. Pat. Nos. 4,186,990, 4,296,993, 4,470,649, 4,534,603, 4,728,304, 4,784,622, 4,981,450 and 5,232,382. The second type is of a one-piece stamped and formed design as disclosed in U.S. Pat. Nos. 3,602,875, 4,480,888, 4,707,052, 4,726,739, 4,934,967, 5,046,972 and 5,232,382. Because the one-piece stamped and formed contact is easier to manufacture and less expensive than the two-piece design, the former is generally intended to be used in computer industry.

While the disadvantages in conventional LIF PGA socket and its associated one-piece stamped and formed contacts as shown in the aforementioned U.S. Patents include that a large insertion force is required if the contact retention force is designedly high for assuring secure retention between the PGA pins and the socket contacts. Secondly, in manufacturing such socket, when the contact is assembled with the socket by insertion into the corresponding cavity in the socket, there is no auxiliary means to guide the movement of the contact along the cavity, so that the contact may be not in its position. As a result, the tilted contact may result in a larger insertion force for the inserted pin of the PGA component because of misalignment therebetween. Otherwise, the manufacturing tolerance is severely required much smaller for avoiding such assembling misalignment. Either of these two results is not desired by the connector manufacturer. Accordingly, the present invention is to provide a modified LIF PGA socket and contacts therein.

SUMMARY OF THE INVENTION

According to the present invention, an electrical socket and contacts therein, and a corresponding method for use in assembling the contacts within the socket insures that the contacts can be easily positioned in precise registration within the cavities in the socket and can be in a preloaded condition for low insertion of the inserted pins of the PGA component. The electrical socket includes an insulative housing with cavities extending vertically therethrough and a plurality of contacts retained in the cavities, respectively. An engagement bar is positioned proximate the upper open end of each cavity so that when the contact is assembled in each corresponding cavity, the front portions of the spring arms of each contact can move along a guiding pin, which is inserted into the cavity from the top open end temporally only for the sake of assembling of the contacts within the socket, and be deflected outwardly. Therefore, the tips of the spring arms of the contact can pass the engagement bar and be positioned by the sides of the engagement bar. As a result, the tips of the spring arms of the contact can abut against the opposite sides of the engagement bar when the guiding pin is removed from the socket, and a larger space is formed between the contact sections of the spring arms of the contact for easy and low insertion force of the pins downward extending from the PGA component.

BRIEF DESCRIPTION OF THE DRAWINGS

FIG. 4(A) is a fractional cross-sectional view of the socket taken along line 4—4 in FIG. 1, with the corresponding contact before assembling.

FIG. 4(B) is a fractional cross-sectional view of the socket of FIG. 4(A) having guiding means inserted therein and the corresponding contact which has not been inserted therein.

FIG. 4(C) is a fractional cross-sectional view of the socket with the associated guiding means of FIG. 4(B) wherein the contact has been inserted therein and ready to confront the corresponding guiding pin of the guiding means.

FIG. 4(D) is a fractional cross-sectional view of the socket with the associated guiding means of FIG. 4(C) to show that the contact is expanded by the guiding pin and the tip of the spring arm is received in the recess.

DESCRIPTION OF THE PREFERRED EMBODIMENT

The preferred embodiment herein described is not intended to be exhaustive or to limit the invention to the precise form disclosed. Rather, it is chosen and described to enable others skilled in the art to utilize its teachings.

Figure 1:
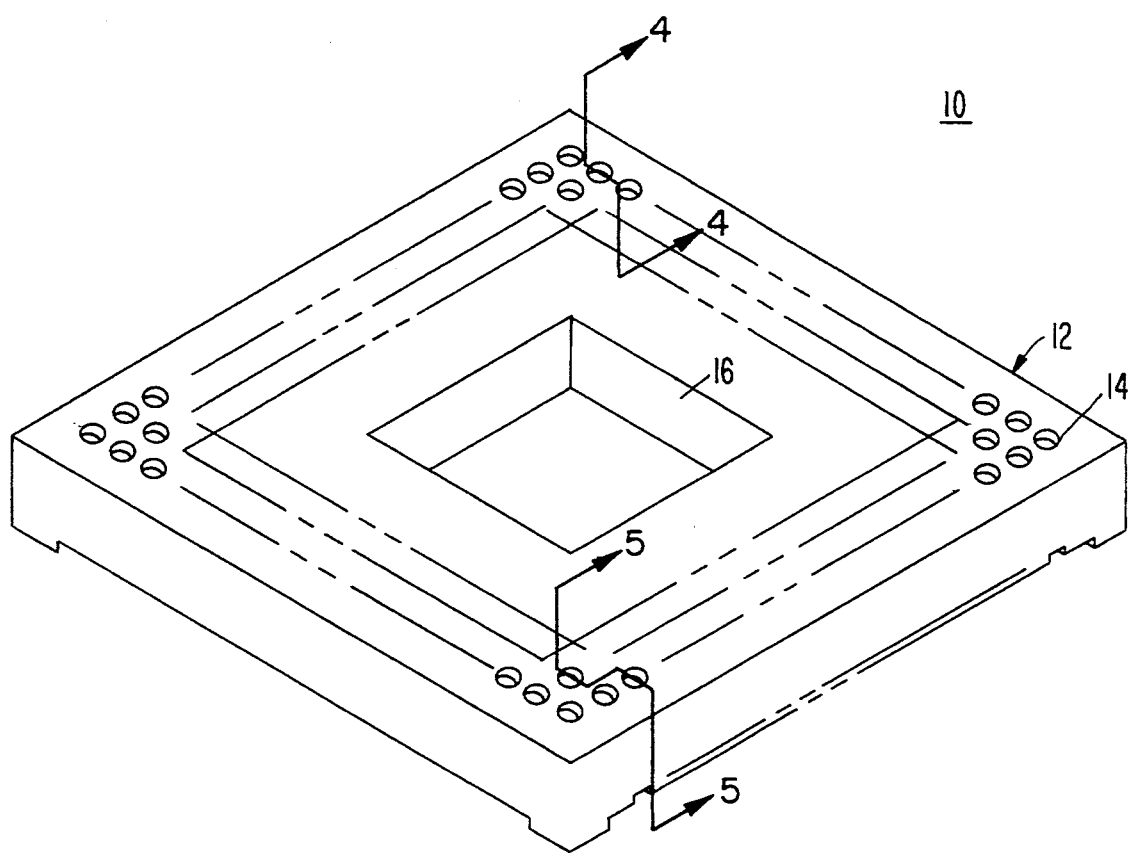
FIG. 1 is a perspective view of a LIF PGA socket without contacts therein.

Referring now to FIG. 1, the low insertion force (LIF) PGA socket 10 includes a generally square insulative housing 12 preferably formed of a molded plastic. A plurality of contact-receiving cavities 14 extend vertically through the housing 12 and are arranged in a specific pattern array which, in the socket 10, is a square array surrounding an through-opening 16 in the center of the socket housing 12.

Figure 2:
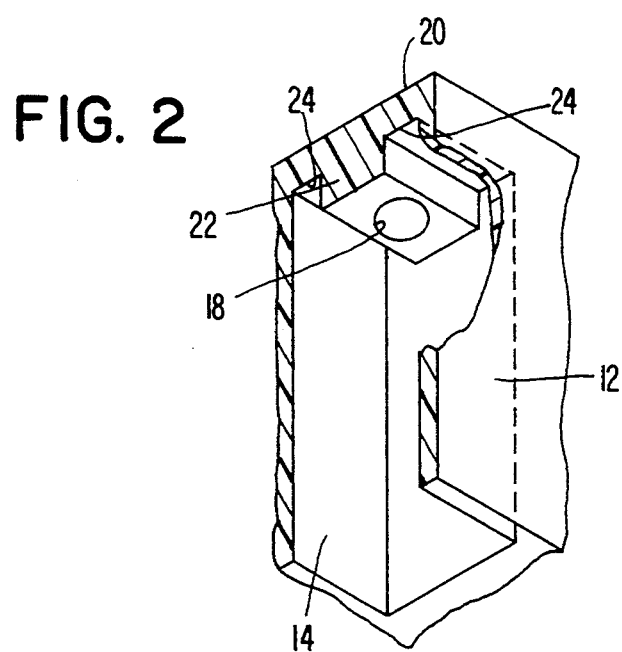
FIG. 2 is a cut-away perspective view of the socket of FIG. 1 to show the cavity therein.

Also referring to FIG. 2, each cavity 14 has generally a square cross-section along its length except at the top end where a smaller round hole 18 terminates for guidable and adjustable reception of the corresponding pin of PGA component (not shown). Namely, a top wall 20 is positioned at the top end of and in alignment with each cavity 14 wherein such hole 18 is generally positioned at the center of the wall 20. An elongated engagement bar 22 is integrally disposed on middle portion of the bottom surface of the wall 20 wherein two ends of the elongated engagement bar 22 are respectively connected to the corresponding opposite inner surfaces of the housing 12 which circumferentially form such cavity. Accordingly, a pair of separate opposite recesses 24 are positioned beside the engagement bar 22 in the cavity 14, respectively. In this embodiment, the width of the engagement bar 22 is larger than the diameter of the hole 18. Certainly, such hole 18 also extends through the engagement bar 22 for the reception of the PGA pin in the cavity 14.

Figure 3:
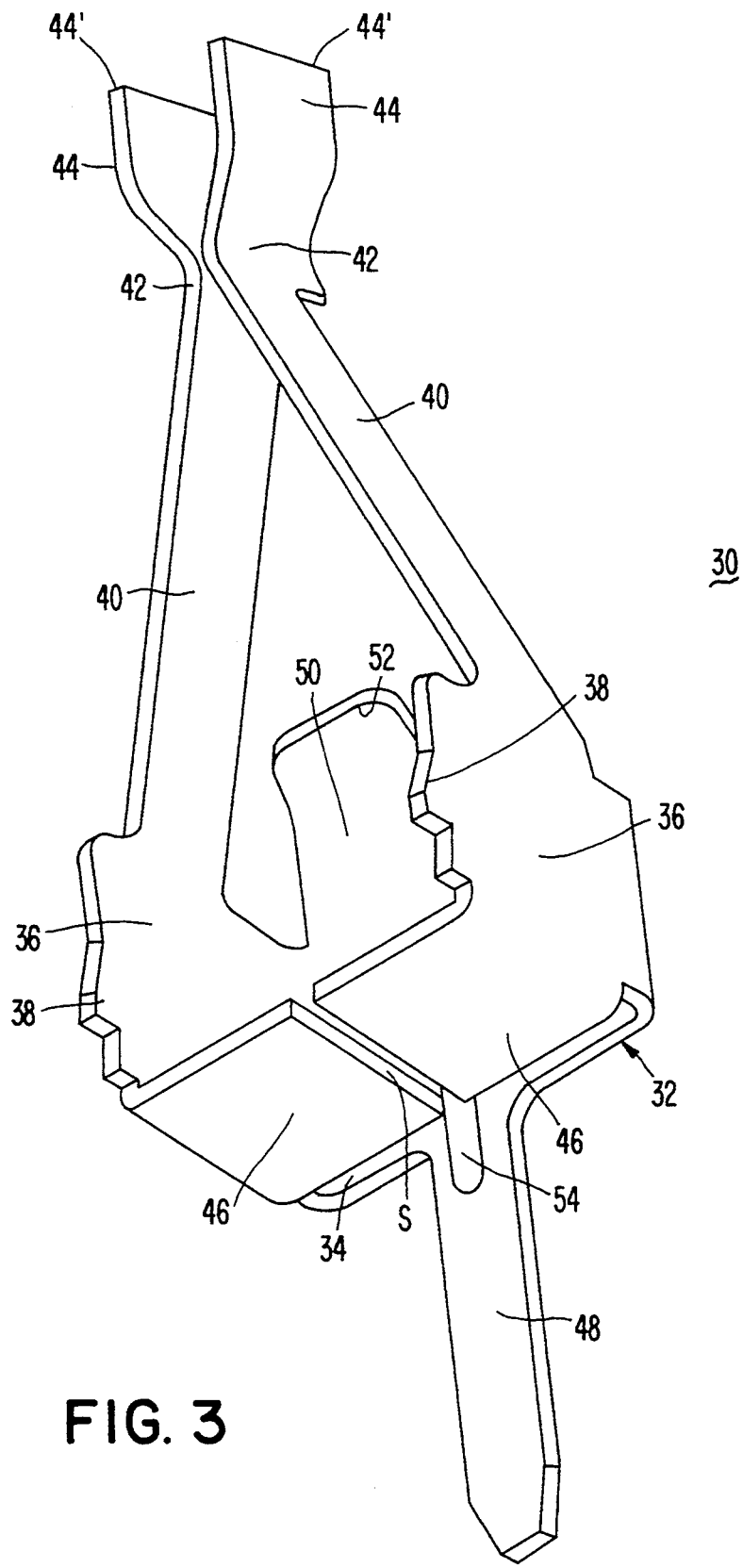
FIG. 3 is a perspective view of the contact for use with the socket.

Referring to FIG. 3, the contact 30 used in the socket 10 is stamped and formed by a metal strip. The formed contact 30 includes a U-shaped main body 32 composed of a base 34 and two side walls 36 generally vertically extending from two side edges of the base 34. At least one barb 38 is formed at the side edge of each side wall 36 for retaining the contact 30 within the cavity 14. A pair of spring arms 40 extend from the upper edges of the side walls 36, respectively, and the top portions of these two spring arms 40 includes converging contact sections 42 deflected close to each other for sandwiching the inserted PGA pin (not shown) therebetween and diverging engaging sections 44 deflected away from each other at their tips 44'. A pair of shielding plates 46 respectively perpendicularly extend from the lower edges of the side walls 36 and face to each other, and only a very small space S is left between the front ends of the two shielding plates 46.

A tail 48 downward extends from the lower edge of the base 34 and a reinforcement and guidance plate 50 extends upward from the upper edge of the base 34. The free upper end 52 of the plate 50 is bent at an angle in a direction toward the space among two arms 40 and the base 34. An elongated rib 54 is formed on the base 34 and the tail 48 along the direction of the tail 48. The base 34 incorporating the integrally extending reinforcement plate 50 provides the whole contact structure with stability in the corresponding cavity 14. The arced end 52 of the reinforcement plate 50 can avoid damages of the housing 12 and of the reinforcement plate 50 or the base 34 of the contact 30, which may result from the compact structural relationship between the contact and the corresponding cavity 14, during loading the contact 30 into the cavity 14 from the bottom.

Figure 4E:
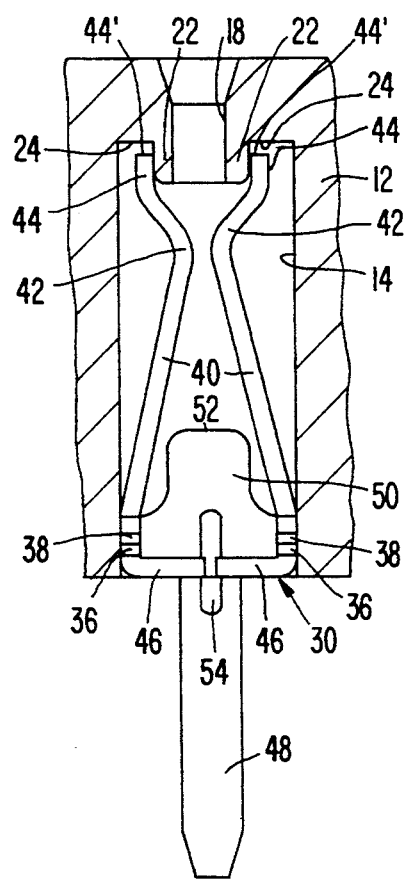
FIG. 4(E) is a fractional cross sectional view of the socket without the guiding means of FIG. 4(D) to show the tip of the spring arm abuts against the engagement bar so that the contact is in a preload condition.
Figure 5:
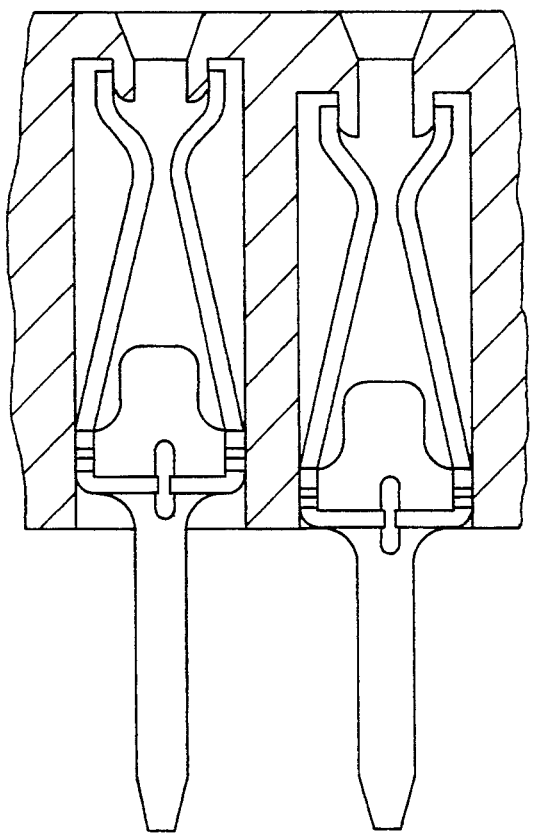
FIG. 5 is a fractional cross-sectional view of the socket taken along line 5—5 in FIG. 1 to show the difference between the contacts of the odd number rows and of the even number rows.

Referring to FIGS. 4(A)-4(E), during assembling the contacts 30 within the corresponding cavities 14 of the socket 10, an auxiliary guiding device 60 is required which may preferably have the similar dimension to that of the socket 10. Guiding pins 62 are on the same pattern array as contact 30 in the socket 10. As shown in FIG. 4(A), the distance between the two tips 44' of the opposite facing arms 40 of the contact 30 is smaller than the width of the engagement bar 22 when the contact 30 itself is in a no external force condition. Hence, it is impossible to have the engaging sections 44 of the contact 14 received in the recesses 24 and abut against the engagement bar 22 without using the auxiliary guiding device 60. Referring to FIG. 4(B), the guiding pins 62 of the guiding device 60, the cross-sectional dimension of each of which is equal to or smaller than the diameter of the hole 18, respectively extend into the corresponding aligned cavities 14 first, and then the contacts 14 are inserted into the corresponding cavities 14 from the bottom. The originally interengaged converging contact sections 42 of the two opposite arms 40 of each contact 30 confront the guiding pin 62 first, and successively and naturally are separated from each other in an outward deflected movement. Similarly, the tips 44 of the arms 40 of the contact 30 are also moved away from each other, so outward deflected moving tips 44 can pass by the corresponding engagement bar 22 and be received in the recesses 24, respectively. Afterwards, the guiding device 60 is removed away from the socket 10 and the guiding pins 62 are naturally withdrawn from the corresponding cavities 14, respectively, so that the arms 30 are intentionally sprung back to the closed positions due to their inherent resilience. Eventually, the diverging sections 44 of the arms 30 respectively abut against the two sides of the engagement bar 20 in a preload condition, and the contact sections 42 of the two opposite arms 30 are spaced from each other with a space therebetween in order to achieve low insertion force to the inserted PGA pin. As shown in FIG. 5, the contact sections 42 of the contact 30 in one row are designedly arranged in a higher position than those in an adjacent row. The vertical positions of the contact sections 42 of the contacts 30 are, row by row, in the form of staggering. In other words, the vertical position of the contact section 42 of the contact 30 in the odd number row is different from that of the contact 30 in the even number row. This arrangement may be deemed well-known for purposely lowering the whole insertion force during inserting the pins of the PGA component into the corresponding cavities 14 of the socket housing 12. To not only keep the same length of the spring arms 40 of all contacts 30 for maintaining the identical resiliency character thereof, but also stagger the contact sections 42 of the contacts 30 row by row, the top wall 20 of one cavity 14 in one row, in which cavity 14 the contact section 42 of the contact 30 is in a higher position, is thinner than that of another cavity 14 in an adjacent row, as shown in FIG. 5. In contrast with the cavity 14, the contact 30 in one row, whose contact section 42 is in a higher position, has a longer tail 48 than that in the adjacent row. With reference to FIG. 5, it is appreciated that the recesses 24 in cavities 14 of the odd number rows and those of the even number rows are still identical, and even though the contacts of two adjacent rows are not in the same vertical position within the socket, the tips of the adjacent tails extending out of the socket 10 are still in the same vertical position. However, the overall appearance of the socket 10 is identical to that of other sockets which have no staggering structure in their contact design.

It is noted that in comparison with the prior art one-piece stamped contact in a LIF PGA socket, the present invention has advantages as follows;

(1) By using the guiding pin 62 and the engagement bar 22, two opposite spring arms 40 in the corresponding cavity 14 can be precisely loaded into the socket 10 without the possibility of tilting, and the positions of the free tips 44' of the two opposite arms 40 of the assembled contact 40 can be controlled by the engagement of the engaging sections 44 of the arms 40 with the engagement bar 22. This assures that the arms 40 is aligned and ready to mate with the inserted PGA pin. This feature reduces the possibility of misalignment of the contact 30 and allows a wider range of manufacture tolerance.

(2) The engagement bar 22 incorporating the engaging sections 44 also obtains a low insertion force to a PGA component but still remains the desired retention force therein.

(3) The reinforcement plate 50 extending in an opposite direction to the tail 48 from the base 34, can balance the exerted stress from the arms 40 and make the whole structure of the contact 30 stable in the cavity 14. The tapered end 52 of the reinforcement plate 50 also allows easy, guidable and reliable loading of the contact 30 into the cavity 14 of the socket 10 from the bottom.

(4) The rib 54 can enhance the structural strength along the tail 48 to resist any inappropriate bending stress or moment occurring around such tail 54.

(5) The shielding plates 46 is positioned proximate the bottom end of the cavity 14 to prevent contamination of the solder into the cavity 14 for assuring the easy insertion of the PGA component without improper obstacles.

While the present invention has been described with reference to a specific embodiment, the description is illustrative of the invention and is not to be construed as limiting in the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A LIF PGA socket for use with a PGA component comprising:
    an insulative housing having a plurality of cavities extending vertically therethrough;
    a top wall positioned at the top of each cavity having a small through-hole in the center;
    an engagement bar integrally attached on an underside of each top wall to form two opposite recesses beside said engagement bar in the corresponding cavity; and
    a plurality of contacts received in the corresponding cavities, respectively, each contact having a pair of spring arms for sandwiching a pin extending downward from the PGA component, a top tip of each arm of the contact being adapted to be received in the corresponding recess in the cavity, wherein
    said contact includes a base having two side walls perpendicularly extending from two side edges thereof, said pair of arms extending upward from a top portion of the side walls, respectively, each arm including a converging section to contact the pin of said PGA component and a diverging section to engage the engagement bar, and said contact further includes a reinforcement plate extending upward from an upper edge of said base, a slanted tip positioned at a top portion of said reinforcement plate, whereby the reinforcement plate incorporates the base to stabilize the contact in the cavity and the slanted tip of said reinforcement plate allows easy, guidable and reliable loading of the contact into the cavity from the bottom.

2. The socket as described in claim 1, wherein at least one barb is positioned at a side edge of each side wall of the contact.

3. The socket as described in claim 1, wherein a pair of juxtaposed shielding plates perpendicularly and respectively extending from lower edges of said pair of side walls and close to each other whereby a small space is positioned therebetween.

4. The socket as described in claim 1, wherein a tail extends from a lower edge of said base of the contact, and a rib is formed along said tail and said base.

* * * * *